(12) United States Patent
Hsu et al.

(10) Patent No.: US 7,293,035 B2
(45) Date of Patent: Nov. 6, 2007

(54) SYSTEM AND METHOD FOR PERFORMING COMPRESSION/ENCRYPTION ON DATA SUCH THAT THE NUMBER OF DUPLICATE BLOCKS IN THE TRANSFORMED DATA IS INCREASED

(75) Inventors: Windsor Wee Sun Hsu, San Jose, CA (US); Shauchi Ong, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 505 days.

(21) Appl. No.: 10/880,843

(22) Filed: Jun. 30, 2004

(65) Prior Publication Data

US 2006/0004808 A1    Jan. 5, 2006

(51) Int. Cl.
*G06F 17/30* (2006.01)
(52) U.S. Cl. ...................................... 707/101
(58) Field of Classification Search ............ 707/8, 707/100, 101, 203, 205, 206
See application file for complete search history.

(56) References Cited

U.S. PATENT DOCUMENTS 6,799,258 B1 *   9/2004   Linde .......................... 711/162
6,895,415 B1 *   5/2005   Rezaul Islam et al. ..... 707/204

* cited by examiner

*Primary Examiner*—John Cottingham
*Assistant Examiner*—Cheryl Lewis
(74) *Attorney, Agent, or Firm*—Joseph P. Curtin, L.L.C.

(57) ABSTRACT

Desired transformations such as compression, encryption and/or encoding are applied to data such that the number of duplicate chunks in the transformed data is increased and the chunks are predominantly of a predetermined size. Additionally, the unique and duplicate chunks of transformed data are identified. A variable-sized window is passed over the set of data to generate a working chunk of transformed data that is of the predetermined size. When the working chunk is a duplicate chunk of data, a next group of untransformed data is selected from the set of data, transformed and then evaluated. When the working chunk is not a duplicate chunk of data, a next group of data is selected by sliding the window over the set of data to generate another working chunk that is evaluated.

18 Claims, 11 Drawing Sheets

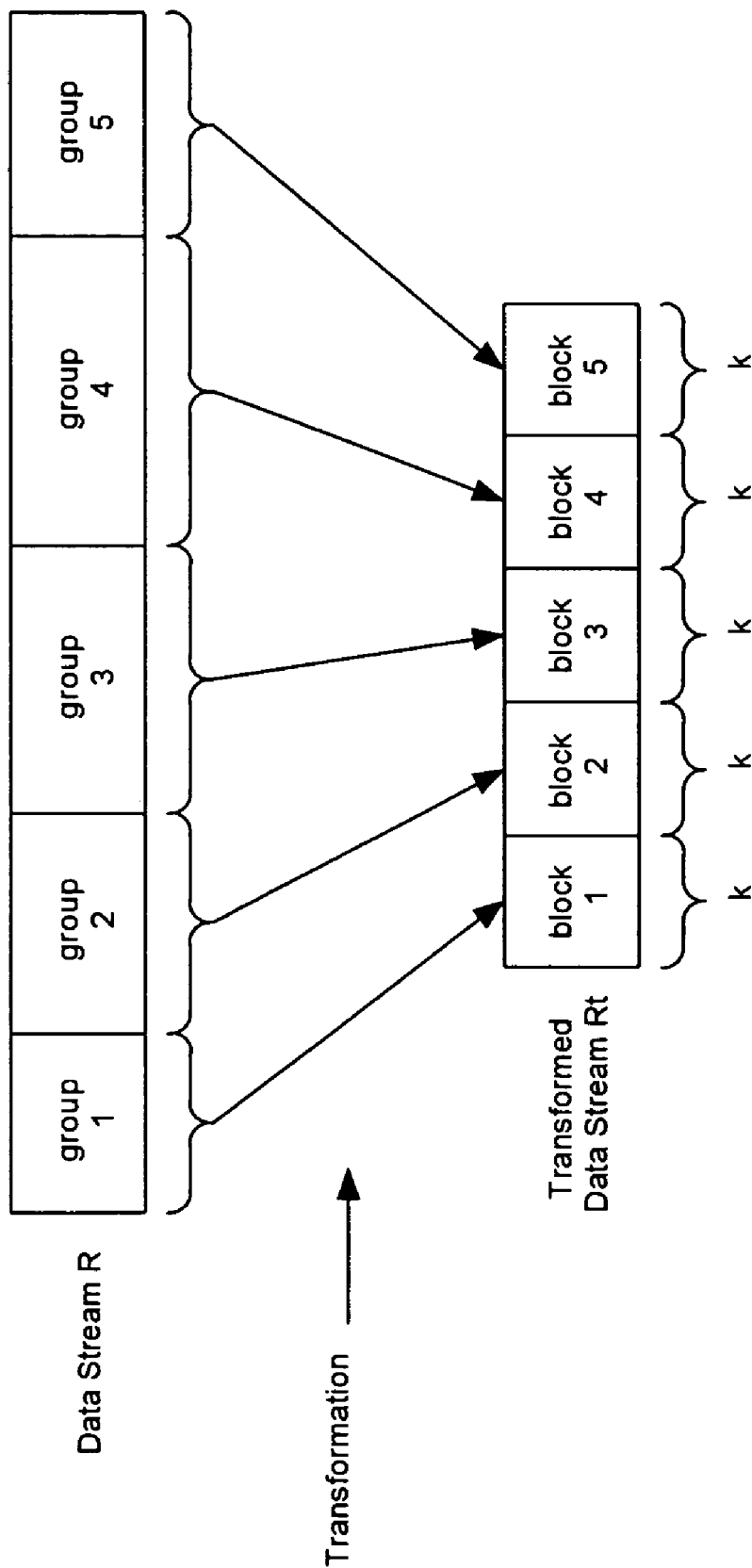

SYSTEM AND METHOD FOR PERFORMING COMPRESSION/ENCRYPTION ON DATA SUCH THAT THE NUMBER OF DUPLICATE BLOCKS IN THE TRANSFORMED DATA IS INCREASED

BACKGROUND OF THE INVENTION

1. Field of the Invention

The present invention relates to data processing systems. More particularly, the present invention relates to a system and a method for applying desired transformations to data such that the number of duplicate chunks in the transformed data is increased and the chunks are predominantly of a predetermined size. Additionally, the present invention provides a technique for determining the unique and duplicate chunks of transformed data.

2. Description of the Related Art

There are many copies of the same data existing in the world. One example is that many PC users have the same applications installed on their computer. Another example is when email and attachments are forwarded; the different recipients of the email and attachments end up storing the same email and attachments. Consequently, as computing and storage becomes more centralized, servers increasingly store the same data for many different users and/or organizations. As other examples, many critical applications, such as snapshot-type applications, time travel-type applications, data archival-type applications, etc., require multiple copies of largely identical data be maintained. A significant amount of storage and network bandwidth could be saved when duplicate data is identified. Moreover, errors affecting a portion of data could be repaired with an identified duplicate portion so that reliability in data storage and network transmission could be increased.

In most situations, however, it is desirable to transform data before storage or transmission. Examples of such transformations include compression for reducing the overall data size, encryption for preventing unauthorized access to data, and various forms of encoding for supporting different character sets (e.g., uuencode). Many transformations are stateful, meaning that the transformed data depends not only on the data being transformed, but also on some state that typically depends on previous transformed data. With stateful transformations, any change in the data trickles down beyond the point of change in the transformed data. Accordingly, the transformed data of an updated object after the point of change tends to be different from the corresponding transformed data of the original object. Consequently, the number of duplicate portions would be greatly reduced after a stateful transformation even though a significant amount of the data may be duplicative.

To accommodate stateful-type changes, one conventional approach is to detect duplicate portions of the data before transformation and then perform the desired transformation on the unique portions of data. The more important transformations, however, tend to be size-changing, meaning that the transformed data has a different size than the input data. Transformed unique portions of data would likely have variable sizes, thereby making the transformed unique portions difficult to handle and limiting the potential savings in storage and network bandwidth because data processing systems tend to have a preferred fixed-size unit for data management purposes, referred to herein as blocks. As used herein, a block is a chunk of data having a fixed size for a given data processing system.

Another conventional approach for accommodating stateful-type changes is to divide the data into chunks based on one or more specific patterns or markers in the data. For example, see T. D. Moreton et al., "Storage, Mutability and Naming in Pasta," Proceedings of the International Workshop on Peer-to-Peer Computing at Networking 2002, Pisa, Italy, May 2002, and A. Muthitacharoen et al., "A Low-Bandwidth network file system," Proceedings of the 18$^{th}$ ACM Symposium on Operating Systems Principles (SOSP-01) (G. Ganger, ed.), vol. 35, 5 of ACM SIGOPS Operating Systems Review, (New York), pp. 174-187, ACM Press, Oct. 21-24, 2001. The chunks can then be transformed individually and duplicate blocks are detected in the transformed data. Such an approach is expensive because the data is processed twice and two layers of mapping are required for the data. Further, the effectiveness of such an approach is limited because the transformed chunks are likely to straddle block boundaries and markers tend not to appear consistently in real data.

Consequently, what is needed is a technique of applying desired transformations to data such that the number of duplicate chunks in the transformed data is increased and the chunks are predominantly of a fixed size. What is also needed is a technique for determining the duplicate chunks of transformed data.

BRIEF SUMMARY OF THE INVENTION

The present invention provides a technique of applying desired transformations to data such that the number of duplicate chunks in the transformed data is increased and the chunks are predominantly of a fixed size. Additionally, the present invention provides a technique for determining the duplicate chunks of transformed data.

The present invention provides a method for determining unique chunks of data and duplicate chunks of data of a transformed set of data that has been transformed, such as by compression, encryption and/or encoding. A group of data is selected from the set of data, such that the selected group of data has a beginning and an end and is continuous between the beginning and the end of the selected group of data, and such that a working chunk of transformed data generated from the selected group of data is of size equal to a predetermined size. Then, it is determined whether the working chunk is a duplicate chunk of data.

The process repeats by selecting a next group of data, generating a next working chunk of data from the next selected group of data, and evaluating whether the next working chunk of data is a duplicate chunk of data. When the working chunk of data is a duplicate chunk of data, the beginning of the next group of data is immediately after the end of a preceding selected group of data that generated a working chunk of data that was a duplicate chunk of data. When the working chunk of data is not a duplicate chunk of data, the beginning of the next group of data is a predetermined number of data units after the beginning of a preceding selected group of data that generated a working chunk of data that was not a duplicate chunk of data. The data units can be, for example, a bit, a byte or a word.

The data of the data set between the end of the last selected group of data that generated a working chunk that was a duplicate chunk of data and the beginning of the next selected group of data that generated a working chunk that was a duplicate chunk of data is processed as follows. A group of data is selected from this data such that the selected group of data has a beginning and an end and is continuous between the beginning and the end of the selected group of data, and such that a working chunk of transformed data generated from the selected group of data is of size equal to or less than a predetermined size. This working chunk is classified as a unique chunk of data. The current process then repeats by selecting a next group of data such that the beginning of the next group of data is immediately after the end of a preceding selected group of data. In a preferred embodiment of the present invention, at most one unique chunk of data can have a size that is less than the predetermined size.

According to an exemplary embodiment of the present invention, the working chunk of data is considered a duplicate chunk of data in a probabilistic sense. In another exemplary embodiment of the present invention, determining whether the working chunk of data is a duplicate chunk of data includes computing a mathematical value based on the working chunk of data and comparing the mathematical value to contents of a data structure such as a hash table. The mathematical value for a chunk of data classified as a unique chunk of data is stored in the data structure. An alternative exemplary embodiment provides that the mathematical value is based on a cryptographic hash.

According to another embodiment, the mathematical value is stored for a predetermined period of time. In yet another embodiment, the data structure has a maximum predetermined size, and the oldest value is removed from the data structure when a mathematical value for the working chunk is stored in the data structure and causes the data structure to exceed the maximum predetermined size.

Another exemplary embodiment of the present invention provides that the determination of whether the working chunk of data is a duplicate chunk of data is based on a checksum generated from the working chunk of data. A further alternative exemplary embodiment provides that the determination of whether the working chunk of data is a duplicate chunk of data is based on a comparison of the working chunk of data to previously seen chunks of data.

One exemplary embodiment of the present invention provides that when a group of data is selected, a marker is located in the working chunk of data. A mathematical function of data around the marker is then computed and it is determined whether a remembered offset is greater than or equal to the current offset of the marker from an edge of the working chunk of data when the computed mathematical function of data around the marker has been previously seen. A number y is set to be equal to the predetermined size minus a quantity of a remembered offset minus the current offset of the marker in the working chunk of data when the remembered offset is greater than or equal to the current offset of the marker. The number y is set to be equal to the remembered offset minus the current offset of the marker in the working chunk of data when the remembered offset is less than the current offset of the marker. The number y is set to be equal to the offset of the marker when the computed mathematical function of data around the marker has not been previously seen. The number y is set to be equal to the predetermined size when the working chunk does not contain the marker. A number x is set to be equal to an offset in the untransformed set of data corresponding to the offset of the number y in the working chunk of data. The location of the beginning of the next group of data is shifted by x data units. According to one alternate embodiment of the present invention, the marker is located within the selected group of data rather than the corresponding working chunk.

BRIEF DESCRIPTION OF THE DRAWINGS

The present invention is illustrated by way of example and not by limitation in the accompanying figures in which like reference numerals indicate similar elements and in which:

FIG. 1A depicts an exemplary data stream R that is transformed, such as by compression and/or by encryption and/or encoding, into transformed data stream Rt for illustrating the present invention;

DETAILED DESCRIPTION OF THE INVENTION

The present invention provides a system and a method that applies transformations, such as compression and/or encryption and/or encoding, to data so that the transformed data contains or is likely to contain many duplicate chunks of data of a preferred size. Additionally, the present invention provides a technique for identifying the chunks of data that are duplicates or are likely to be duplicates of chunks of transformed data that have been previously seen.

FIG. 1A depicts an exemplary data stream, or set of data, R that is transformed, such as by compression and/or by encryption and/or encoding, into a transformed data stream, or transformed set of data, Rt for illustrating the present invention. Data stream R is shown as having variable-sized groups of data that have been transformed into chunks of data that are each of size k. As used herein, the term "block" means, in particular, a chunk of data of size k. In FIG. 1A, while data groups 1-5 each have different sizes, data groups 1-5 are respectively transformed into blocks 1-5, which are each of size k.

Figure 1B:
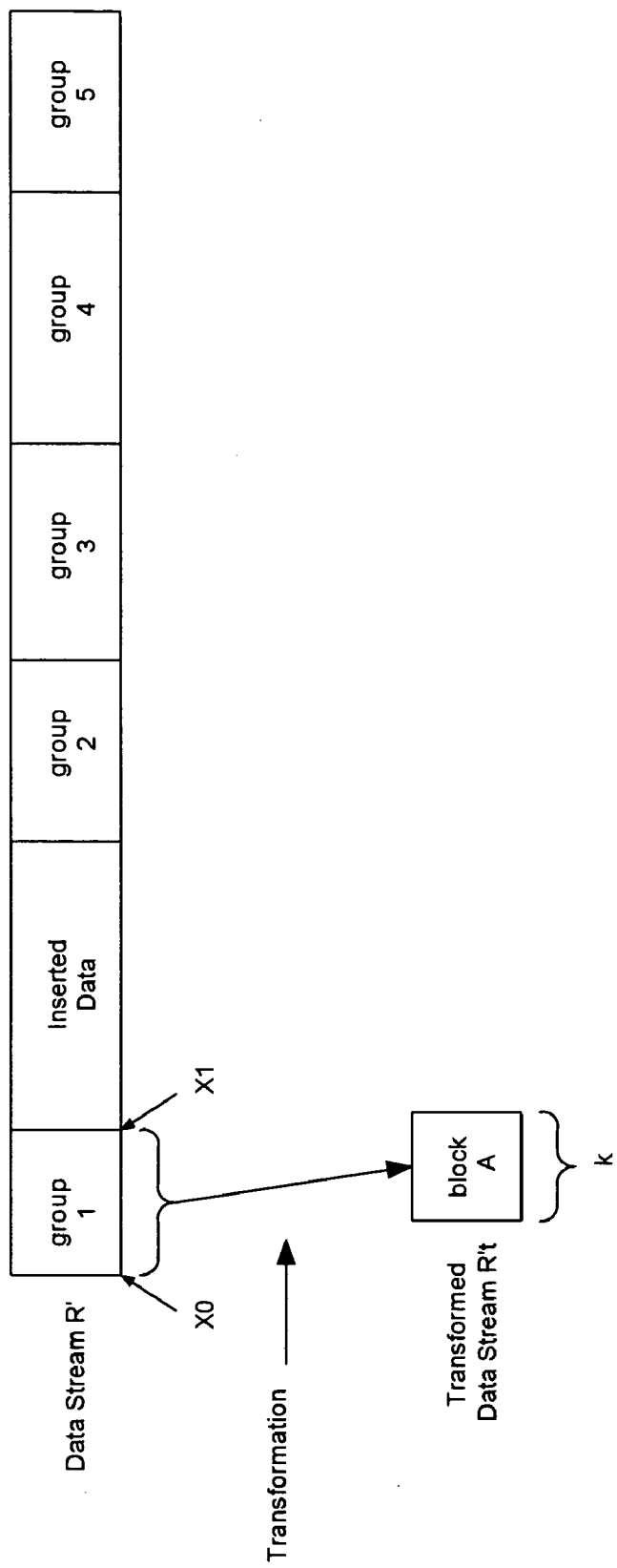
FIGS. 1B-1I depict a sequence of steps according to the present invention of transforming an exemplary data stream R' and identifying duplicate chunks and unique chunks resulting from the transformation.

Now consider the situation in which data stream R undergoes a change to form data stream R'. FIG. 1B depicts exemplary data stream R after undergoing a change that has caused some data to be inserted between data groups 1 and 2 to form a second data stream R'. The present invention identifies duplicate chunks after data stream R' has been transformed by using a window that slides, or moves, across data stream R' until a match is found with previously seen data. The window size varies dynamically and is selected so that as the window moves across data stream R', chunks of transformed data are created that are predominantly of the fixed size k. In some cases, the transformed data cannot be exactly of size k, in which case the largest window is selected so that the data within the window after transformation is of a size that is as close to, but smaller than k. For ease of illustration, data d has been inserted near the beginning of data stream R to form data stream R'. It should be understood that the technique of the present invention is applicable when a data stream, or set of data, undergoes any change, including a change that causes new data to be inserted or data to be removed from any portion of a data stream, or set of data, R.

Figure 2:
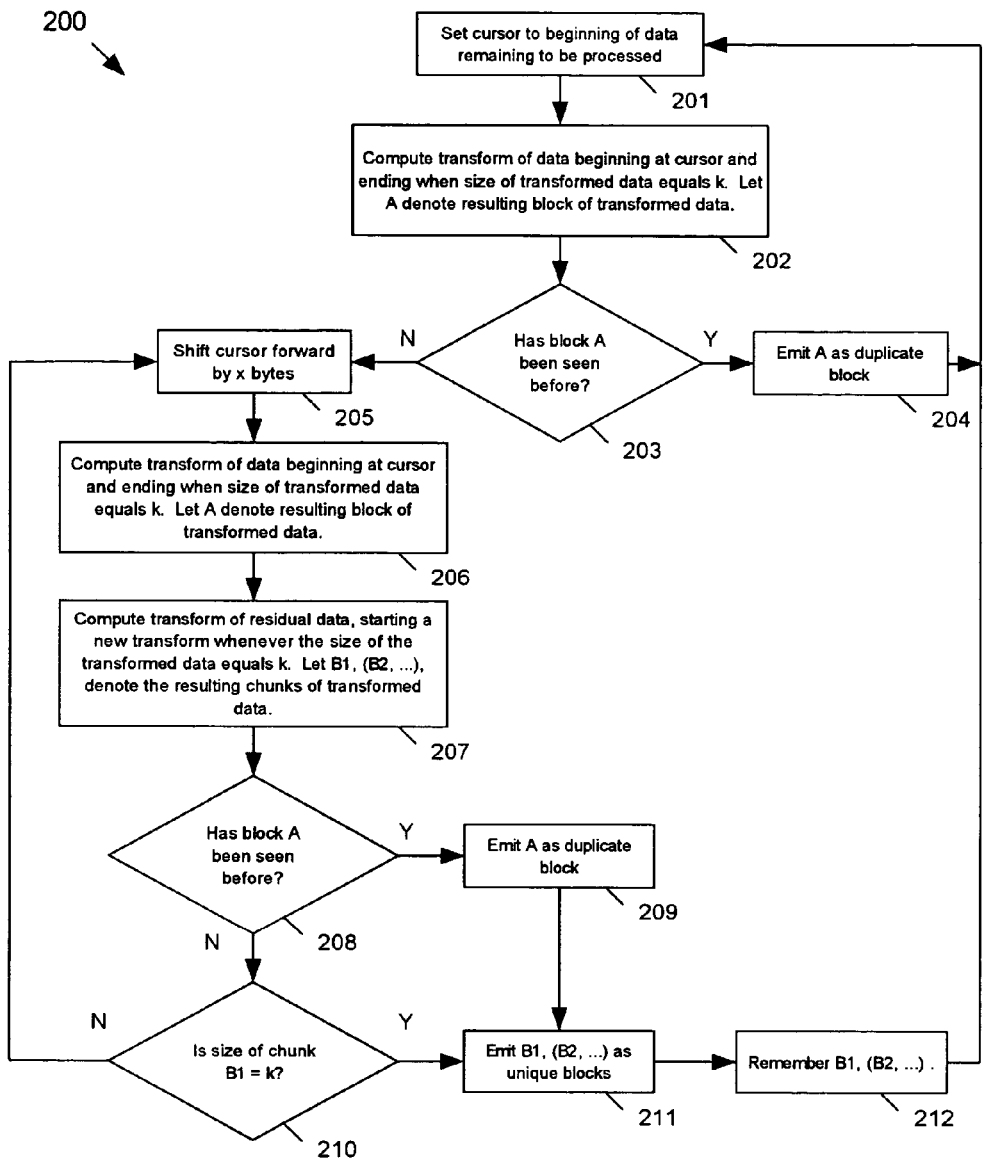
FIG. 2 shows a flow chart of a process according to the present invention for transforming a data stream R such that the transformed data stream Rt has many duplicative chunks and such that the unique chunks resulting from the transformation are identified.

FIG. 2 shows a flow chart 200 of a process according to the present invention for transforming a data stream R' and for identifying duplicative chunks (i.e., chunks of data that have been previously seen) and unique chunks of data resulting from the transformation. At step 201, a pointer, or cursor, is set to the beginning of the data remaining to be processed in R', which is indicated by "X0" in FIG. 1B. At step 202, a transformation of data stream R' is computed beginning at the cursor and ending at the point where the size of the transformed data equals k, which is indicated as "X1" for this example. Accordingly, the window used by the present invention extends between points X0 and X1. For convenience, the transformed chunk is referred to herein as block A. At step 203, the transformed chunk, i.e., block A, is compared to previously remembered chunks, such as the chunks that were formed when data stream R was originally transformed (FIG. 1A). If, at step 203, it is determined that block A has been previously encountered, flow continues to step 204 where block A is designated as a duplicate chunk, or block. For the present example, block A in transformed data stream R't (FIG. 1B) is identical to block 1 in transformed data stream Rt. Flow returns to step 201 for processing the rest of data stream R'.

Figure 1C:
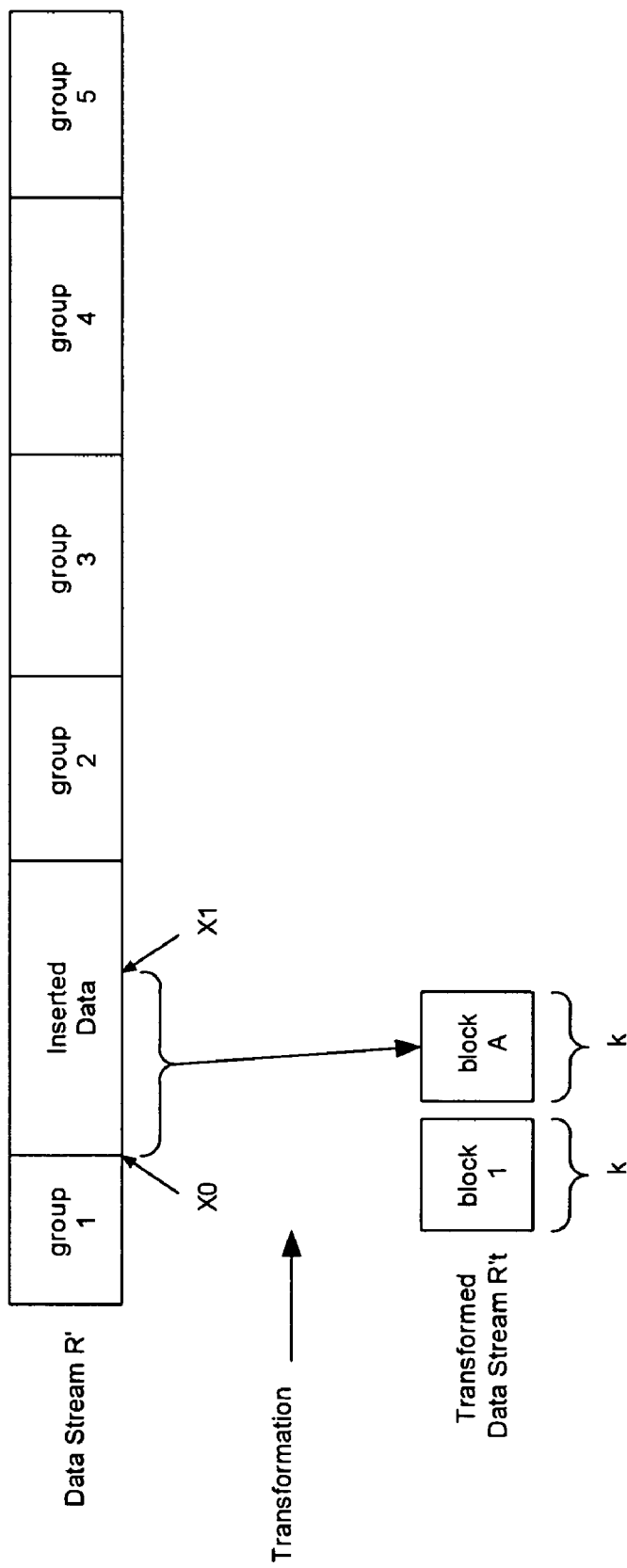

Steps 201 through 204 are repeated for the next portion of data stream R', which is shown in FIG. 1C. At step 201, the cursor, is set to the beginning of unprocessed data stream R', indicated as X0. At step 202, transformation of data stream R' is computed beginning at the cursor and ending at the point where the size of the transformed data equals k, indicated as X1. Note that the window created between X0 and X1 is larger for this particular group of data stream R' than the window that was used to form chunk 1. At step 203, the transformed chunk, i.e., "new" block A, is compared to previously remembered chunks, such as the chunks that were formed when data stream R was originally transformed and the chunks that were formed from the portion of data stream R' that has already been processed.

Figure 1D:
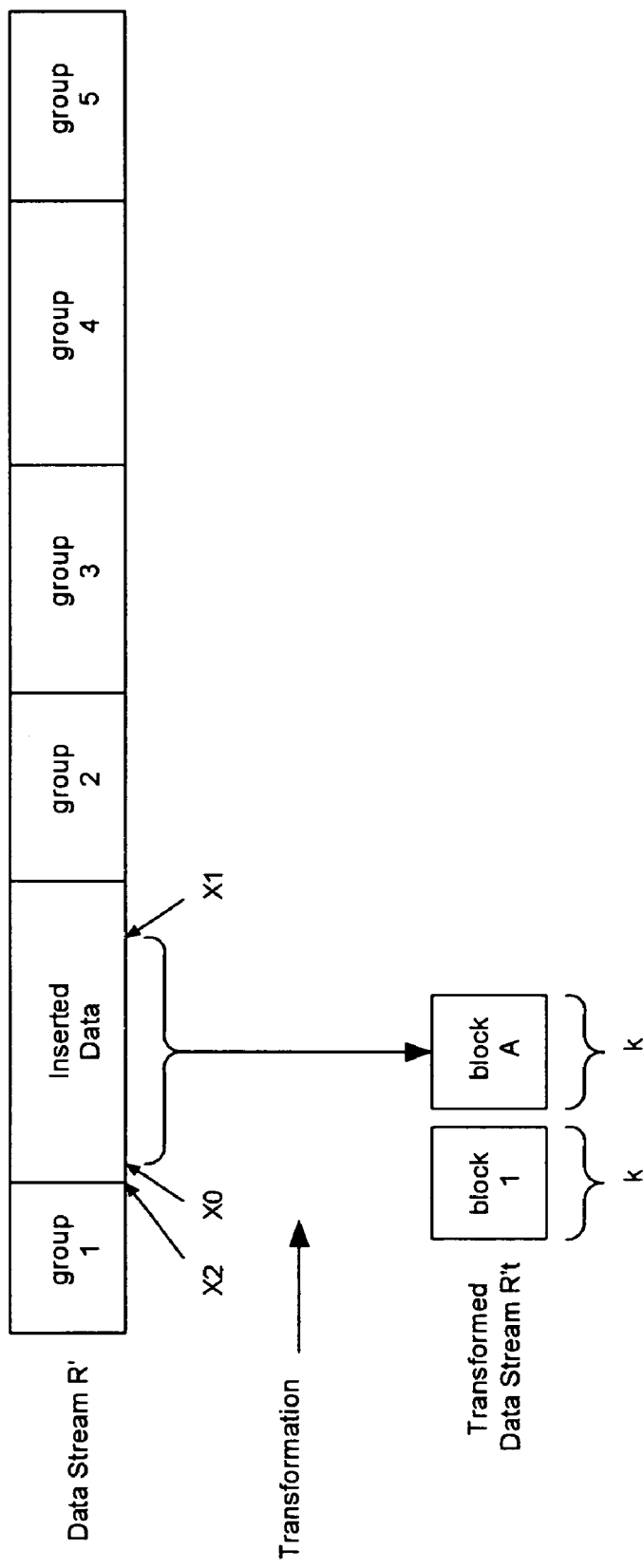

If, at step 203, it is determined that "new" block A does not match any previously remembered chunks, which is the case for this example, flow continues to step 205. At step 205, the window is shifted forward through data stream R' by x bytes, for example, one byte. Flow continues to step 206 where the window size is readjusted so that the data within the window after transformation will be of size k. That is, the size of the chunk of the transformed data that is computed from the beginning of the new location (X0) of the cursor in data stream R' and ending at another selected location (X1) in R' equals k. FIG. 1D depicts the shifting and of the window forward through data stream R' and resizing to form a new block A of size k. At step 207, a transform of the residual data is computed (not shown in FIG. 1D). The residual data is the data that is between the point where the cursor started when flow went from step 203 to step 204 (i.e., X2) to the current starting point of the cursor (i.e., X0). A new transform is started whenever the chunk size of the transformed data equals k. For the situation depicted in FIG. 1D, the size of the transformed residual data would be less that size k. For convenience, the resulting chunks of the transformed residual data are referred to herein as B1, B2, . . . , etc.

Figure 1E:
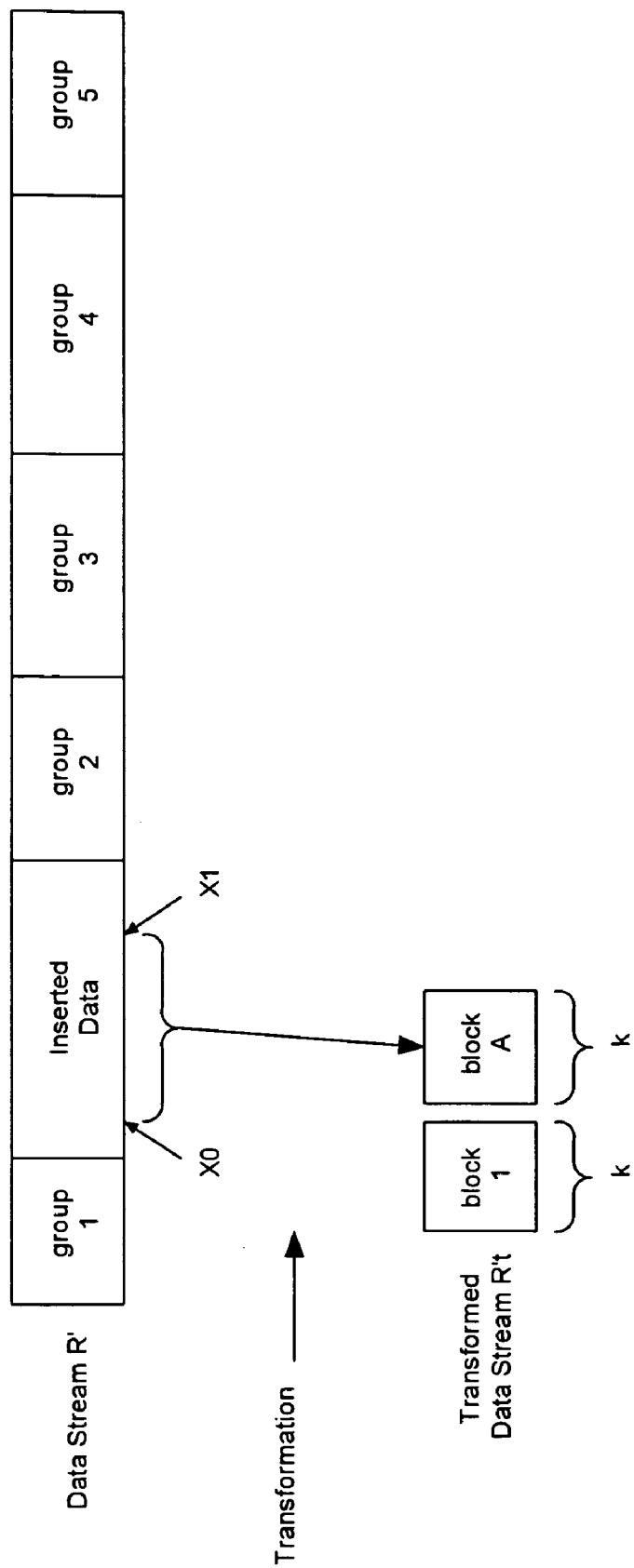
Figure 1F:
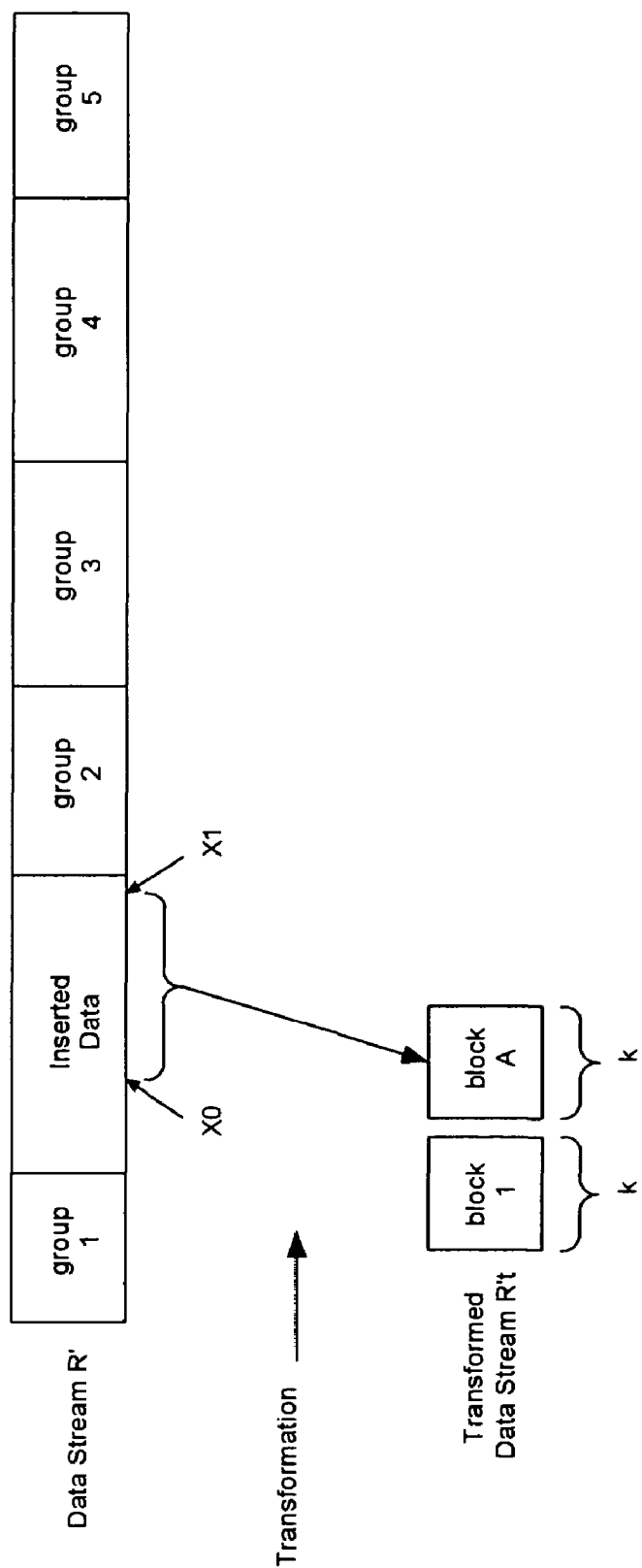
Figure 1G:
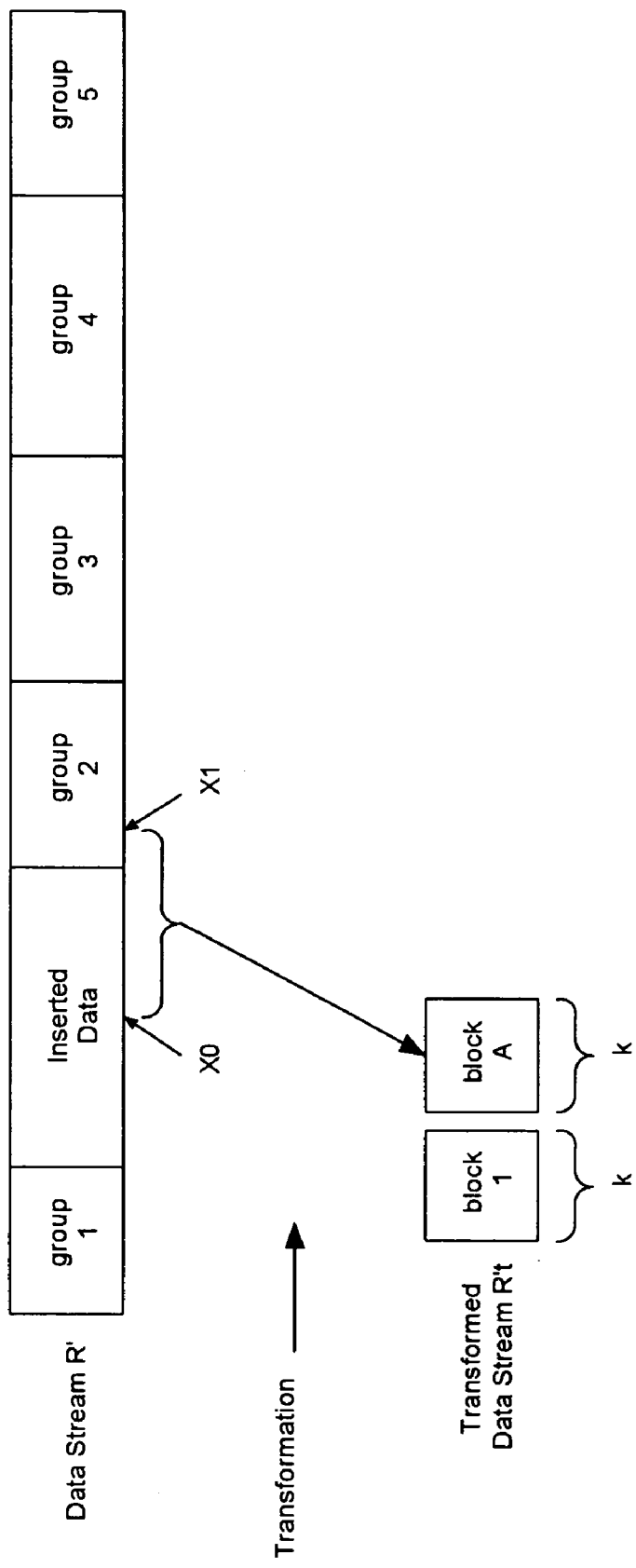
Figure 1H:
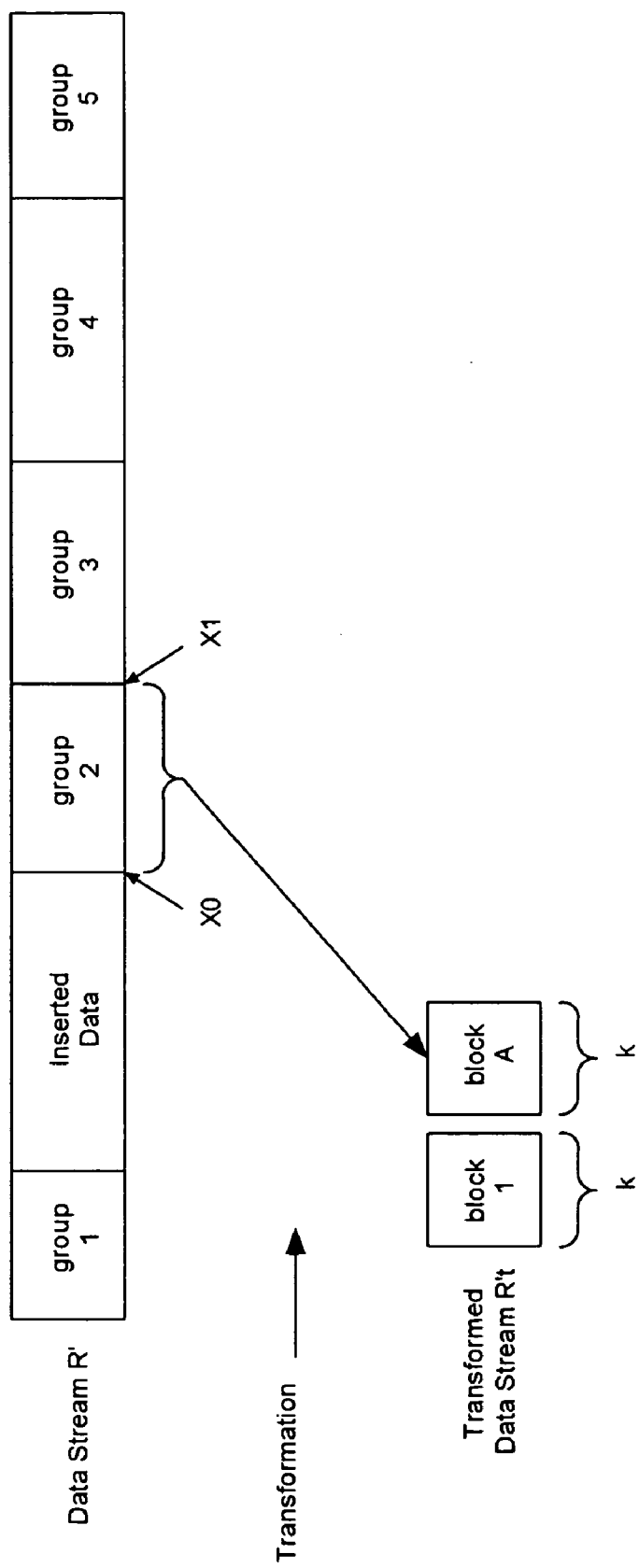

At step 208, it is determined whether block A has been seen before. If, at step 208, it is determined that block A has not been seen before, flow continues to step 210 where it is determined whether the size of chunk B1 is k. If, at step 210, the size of chunk B1 is not of size k, flow returns to step 205. FIG. 1E depicts the shifting of the window (step 205), and the resizing of the window and the transformation of the group of data within the window to form a new block A (step 206). FIGS. 1F-1H depict a sequence of continued shifting of the window and of the resizing of the window, and the transformation of the group of data within the window to form another new block A as steps 205-208 and 210 are performed.

If, at step 208, it is determined that block A has been seen before (FIG. 1H), flow continues to step 209 where block A is designated as a duplicate block. Flow continues to step 211 where block B1 (B2, . . . etc., if the case) is designated as a unique chunk. Block B1 (B2, . . . , etc.) is remembered at step 212. Flow continues to step 201 to process the rest of data stream R'. Note that Step 211 could be performed before step 209 in order to preserve the original sequence of data in the transformed chunks. If at step 210, the size of chunk B1 is k, flow continues to step 211 where block B1 (B2, . . . , etc.), is designated as a unique block. At step 212, block B1 (B2, . . . , etc.) is remembered and flow continues to step 201 for processing the rest of data stream R'. In one exemplary embodiment of the present invention, only chunks that are of size k are remembered unless the chunk is the last in a data stream Rt.

Figure 1I:
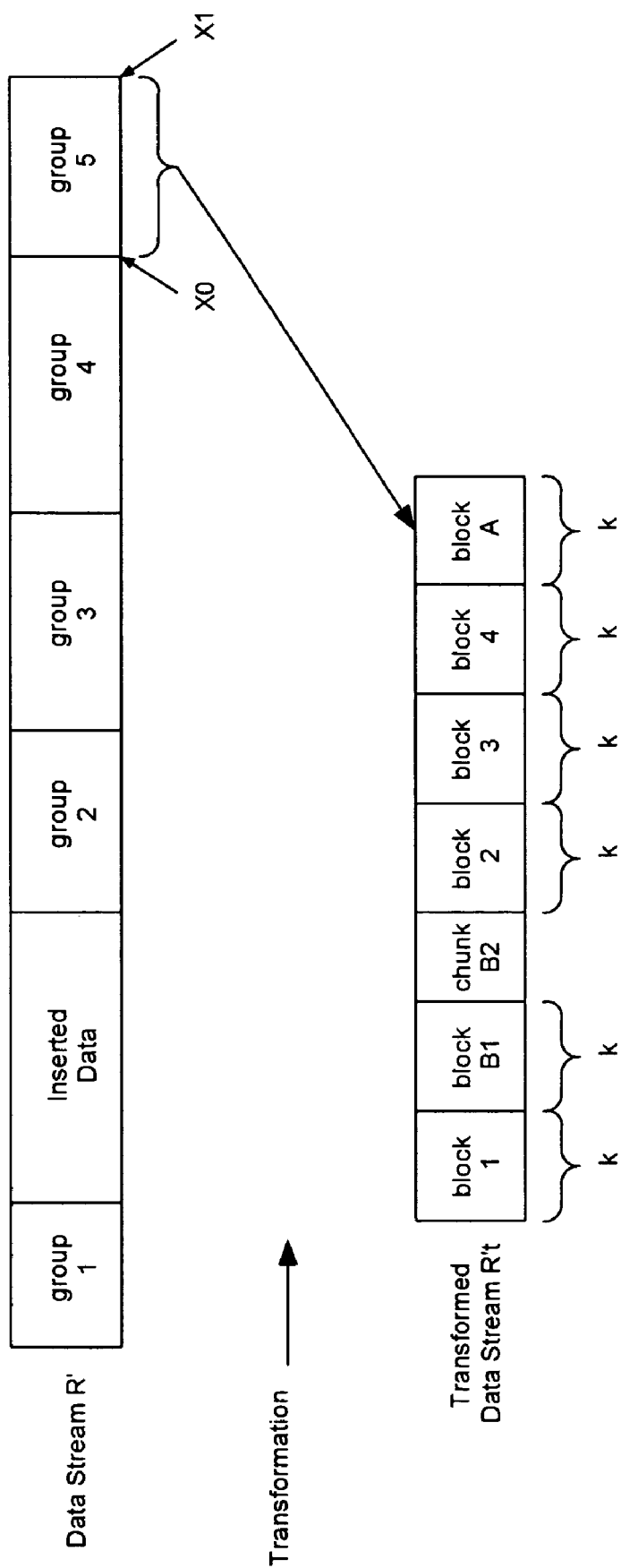

FIG. 1I depicts data groups 2-5 being transformed into chunks 2-5, each of size k. Chunks B1 and B2 are identified as new unique chunks. For this example, block B1 is of size k, while block B2 is of size less that k. Thus, the present invention continues shifting a window and adjusting the size of the window until a match is found for the group of data within the window after transformation, or until the residue or data over which the window has already passed has a transformed size that is of size k or larger.

The present invention provides several alternative embodiments for determining whether a chunk of transformed data matches existing data. In one exemplary embodiment of the present invention, the determination at steps 203 and 208 of whether a chunk of data has been previously seen or is likely to have been previously seen is performed by computing a mathematical function of the data and a data structure such as a hash table is examined for the computed value. When a chunk of data is designated as unique, the corresponding computed value of the data chunk is entered into the data structure at step 212. Additionally, the previously remembered chunk or chunks that a particular chunk of data corresponds to can be optionally remembered. To accomplish this, the addresses are tracked of chunks corresponding to each computed value in the data structure.

Alternatively, a series of mathematical functions, or tests, could be used for accelerating the determination of which chunks are identical to previously remembered chunks and to which particular previously remembered chunks. The series of tests have increasing levels of accuracy. The least accurate test is performed first and when that test is positive, the next, more accurate, test is performed, and so on. As the accuracy increases, the probability of false positives in identifying duplicate data decreases, but the cost of performing the test accordingly rises.

For example, the least accurate test could use as the mathematical function a rolling checksum, such as disclosed by A. Tridgell et al., "The rsync algorithm," Technical Report TR-CS-96-05, Australian National University, 1996. The next, more accurate, test could use a cryptographic hash, such as SHA1, for the mathematical function. See, for example, National Institute of Standards and Technology, FIPS 180-1, Secure Hash Standard, US Department of Commerce, April 1995. The most accurate test could be an actual comparison of the data in the chunks.

Thus, given some data to process, the present invention attempts to divide the data into consecutive chunks of transformed data such that each of the chunks after transformation is of a preferred size k. When a transformed chunk is not likely to have been seen before, the present invention tries to shift the chunking in case portions of previously seen data are offset differently with respect to each other. To determine the shift amount, all possible shift positions are tested.

To speed up the process, steps 206 and 207 can be performed by extending the results from a prior iteration of the respective steps. For example, instead of computing the transform of the residual data from scratch on each iteration of step 207, we can instead maintain the transform of the residual data seen so far and only transform the additional x bytes on a new iteration.

Most transformations, however, cannot be rolled meaning that in most cases, step 206 cannot be performed by undoing the contribution of the data that has been shifted over and adding the contribution of the data that has been shifted in. In other words, it is likely that extending the results from a previous iteration of step 206 cannot be efficiently performed.

Consequently, to speed up processing, an exemplary alternative embodiment of the present invention provides an improvement that fundamentally speeds up the determination of the amount the window should shift. Instead of shifting the window by a fixed number of x bytes, the alternate embodiment of the present invention utilizes marker offsets from a chunk boundary for shifting the window. When a mathematical function of the data can be computed at deterministic positions (i.e., data-dependent positions) in the data, the computed values can be matched up efficiently and the shift amount can then be calculated without testing all possibilities. One or more specific patterns or markers in the data are looked for to find the deterministic positions in the data. A marker may be a sequence of bytes in which some mathematical function of the sequence of bytes results in a certain bit pattern. Alternatively, a marker may be as simple as a full stop or a period. The only requirement is that a marker should appear reasonably consistently throughout the data. In one exemplary embodiment of the present invention, Rabin's fingerprint, such as disclosed by M. O. Rabin, "Fingerprinting by random polynomials," Technical Report TR-15-81, Harvard Aiken Computation Laboratory, 1981, which is incorporated by reference herein, is computed looking for the positions in the data in which the last few (n) bits of the computed fingerprint are zeros.

By choosing an appropriate value for n, the expected separation of the deterministic positions can be controlled to be close to or less than k. For each of the deterministic positions, the neighborhood and offset of the markers in the chunks are remembered, and the information is used for controlling how the window slides over the data stream.

Figure 3:
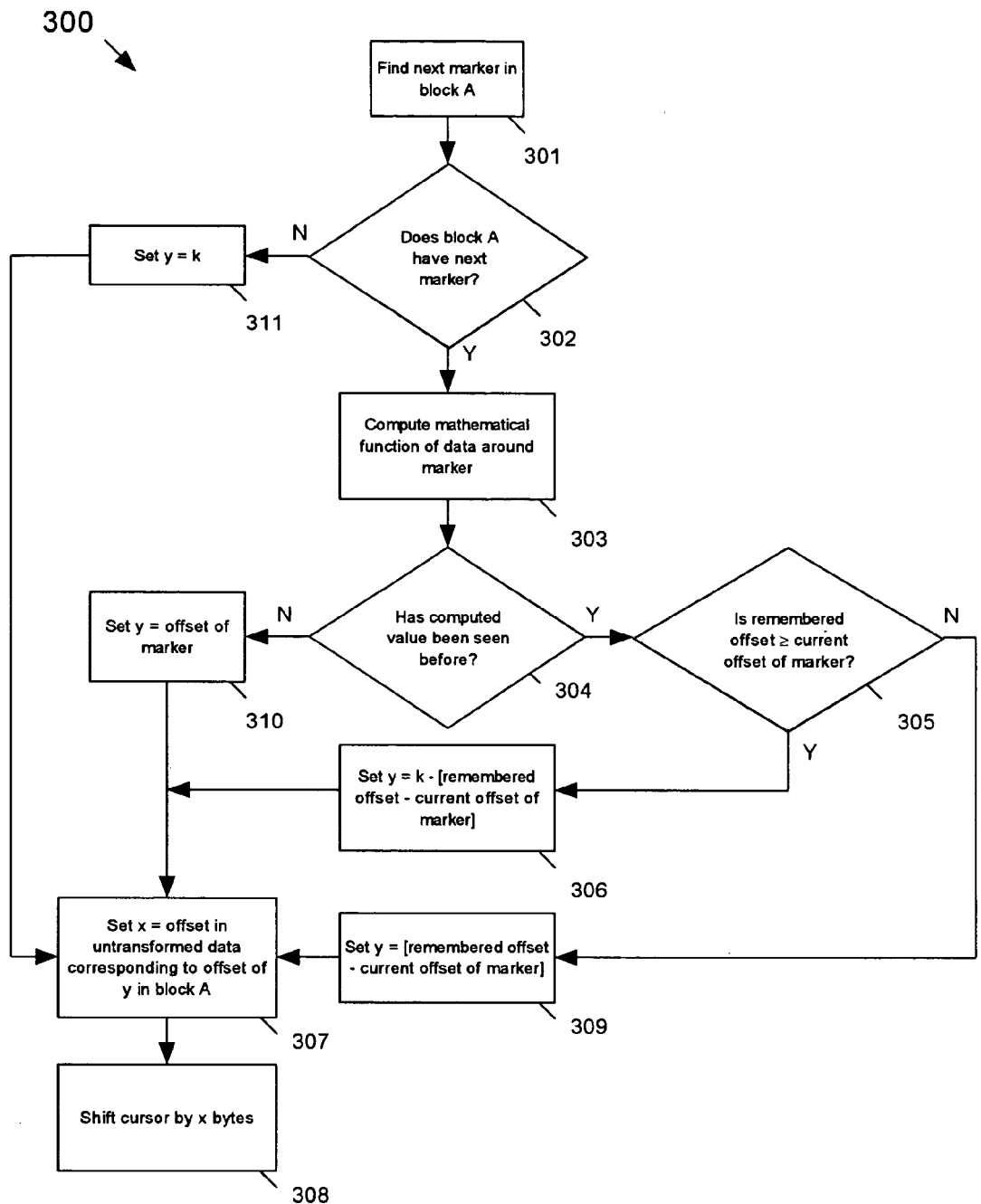
FIG. 3 shows a flow chart of a process according to the present invention for using data markers for matching and aligning data chunks.

FIG. 3 shows a flow chart 300 of a process according to the present invention for using data markers for matching and aligning data chunks. For this alternative embodiment of the present invention, the steps shown in FIG. 3 would replace step 205 in FIG. 2. Alternatively, the steps shown in FIG. 3 may be performed immediately after step 202 in FIG. 2 instead of replacing step 205 in FIG. 2. Additionally, step 212 further includes remembering the first marker in each chunk and the offset of that marker from the chunk boundary.

At step 301 in FIG. 3, the data of block A is searched for the next marker. At step 302, it is determined whether block A has the next marker. If, at step 302, it is determined that block A has the next marker, flow continues to step 303 where a mathematical function is computed around the marker. In one exemplary embodiment of the present invention, a marker is associated with a mathematical function of the data around the marker for identifying the marker. In another exemplary embodiment, the mathematical function that is used is a cryptographic hash.

Flow continues to step 304, where it is determined whether the computed value for the marker has been seen before. In a preferred embodiment, whether the computed value has been seen before is determined by examining a data structure such as a hash table for the computed value. When a computed value has not been seen before, it is entered into the data structure.

If the computed value has been seen before, flow continues to step 305 where it is determined whether the remembered offset from the chunk boundary the last time this particular marker was seen is greater than or equal to the current offset of this particular marker. If so, flow continues to step 306 where y is set equal to k minus the quantity of the remembered offset minus the current offset of the marker. Flow continues to step 307 where x is set equal to the offset in the untransformed data corresponding to the offset y in block A. Flow continues to step 308 where the cursor is shifted by x bytes.

If, at step 305, it is determined that the remembered offset from the chunk boundary the last time this particular marker was seen is not greater than or equal to the current offset of this particular marker, flow continues to step 309 where y is set equal to the quantity of the remembered offset minus the current offset of the marker. Flow continues to step 307.

If, at step 304, it is determined that the computed value for the marker has not been seen before, flow continues to step 310 where y is set equal to the offset marker. Flow continues to step 307.

If, at step 302, it is determined that the block A does not have the next marker, flow continues to step 311 where y is set to equal k. Flow continues to step 307.

It should understood that instead of using markers in the transformed data to align chunks, markers can be used in the untransformed data, in which case step 307 is omitted and the steps shown in FIG. 3 are performed on data stream R' before being transformed to R't. The untransformed data, however, may not be as randomly distributed so that the specific pattern being used as the marker may not occur as consistently throughout the data. Also, when the transformation is a compression operation, looking for markers in the untransformed data would entail processing more data. Generally, the present invention can use the untransformed version of the data to determine whether a chunk of data has been seen before, but when the transformation is many to one (e.g., lossy compression), doing so would miss some duplicate chunks in the transformed data.

Because data usage tends to exhibit temporal locality, any duplicate data is likely to occur close together in time. In one exemplary embodiment, the remembered information is forgotten with the passage of time so that only the information pertaining to data processed during a preceding period of time is remembered. In another exemplary embodiment, the data structures have a maximum size and the oldest information in the data structures is removed whenever the structures exceed a maximum size. In yet another exemplary embodiment, the oldest information is not forgotten, but is archived, for example on low cost storage, and brought back when necessary, such as to recover from error.

The set of data that is to be processed by the present invention may be incrementally increased over time. The remembered information (e.g., hash tables) may be stored in persistent storage, such as disks. New data may be added to the remembered information as it is processed. Additionally, the data to be processed may be geographically distributed, and the remembered information may be moved to a different location for efficient processing and storage.

While the present invention has been described in terms of a technique of applying desired transformations to data such that the number of duplicate chunks in the transformed data is increased and the chunks are predominantly of a fixed size and for determining the duplicate chunks of transformed data, it should be understood that the present invention can be embodied as program steps that are executed by a computer and/or a state machine.

It should also be understood that the present invention can be embodied as a service for applying desired transformations to data such that the number of duplicate chunks in the transformed data is increased and the chunks are predominantly of a fixed size and for determining the duplicate chunks of transformed data.

Although the foregoing invention has been described in some detail for purposes of clarity of understanding, it will be apparent that certain changes and modifications may be practiced that are within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for applying desired transformations to data such that the number of duplicate chunks in the transformed data is increased and the chunks are predominantly of a fixed size, the method comprising:
    (a) selecting a group of data from a set of data, the selected group of data comprising a beginning and an end and being continuous between the beginning and the end of the selected group of data and such that a working chunk of data generated from the selected group of data is of size equal to a predetermined size;
    (b) generating the working chunk of data from the selected group of data by performing at least one of a compression, an encryption and an encoding of the selected group of data;
    (c) determining whether the working chunk comprises a duplicate chunk of data;
    (d) when the working chunk does not comprise a duplicate chunk of data, selecting a next group of data from the set of data, the next selected group of data comprising a beginning and an end and being continuous between the beginning and the end of the next selected group of data, the beginning of the next group of data being a predetermined number of data units after the beginning of the current selected group of data, and returning to (b); and
    (e) when the working chunk comprises a duplicate chunk of data, dividing the data of the data set between the end of the last selected group of data that generated a working chunk that was a duplicate chunk of data and the beginning of the current selected group of data into one or more unique chunks.

2. The method according to claim 1, wherein the data units comprise one of a bit, a byte and a word.

3. The method according to claim 1, wherein the working chunk of data is considered a duplicate chunk of data if it is likely to be identical to a chunk of data that has already been processed and classified.

4. The method according to claim 1, wherein determining whether the working chunk of data comprises a duplicate chunk of data comprises:
    computing a mathematical value based on the working chunk of data; and
    comparing the mathematical value to contents of a data structure.

5. The method according to claim 4, wherein the data structure comprises a hash table.

6. The method according to claim 1, wherein determining whether the working chunk of data comprises a duplicate chunk of data is based on a checksum generated from the working chunk of data.

7. The method according to claim 1, wherein determining whether the working chunk of data comprises a duplicate chunk of data is based on a cryptographic hash of the working chunk of data.

8. The method according to claim 1, wherein determining whether the working chunk of data comprises a duplicate chunk of data is based on a comparison of the working chunk of data to previously processed and classified chunks of data.

9. The method according to claim 1, further comprising storing each unique chunk of data.

10. The method according to claim 1, wherein selecting a next group of data in step (d) comprises:
    locating a marker in a working chunk of data generated from the next group of data;
    determining whether the marker has been seen before;
    retrieving a remembered offset for the marker;
    shifting the location of the beginning of the next group of data by an amount based on the remembered offset for the marker and its current offset from an edge of the working chunk of data; and
    returning to (b).

11. The method according to claim 10, wherein determining whether the marker has been seen before comprises:
    computing a mathematical value of the data around the marker; and
    comparing the mathematical value to contents of a data structure.

12. The method according to claim 11, wherein the data structure comprises a maximum predetermined size, and
    the method further comprising removing an oldest value from the data structure when storing a new mathematical value in the data structure causes the data structure to exceed the maximum predetermined size.

13. The method according to claim 10, further comprising storing the mathematical value for a marker in the data structure when the marker has not been seen before.

14. The method according to claim 13, wherein storing the mathematical value stores the mathematical value for a predetermined period of time.

15. The method according to claim 1, wherein selecting a next group of data in step (d) comprises:
    locating a marker in the next group of data;
    determining whether the marker has been seen before;
    retrieving a remembered offset for the marker;
    shifting the location of the beginning of the next group of data by an amount based on the remembered offset for the marker and its current offset from an edge of the next group of data; and
    returning to (b).

16. The method according to claim 1, wherein selecting a next group of data in step (d) comprises:
    locating a marker in a working chunk of data generated from the next group of data;
    computing a mathematical function of data around the marker;
    determining whether a remembered offset is greater than or equal to a current offset of the marker from an edge of the working chunk of data when the computed mathematical function of data around the marker has been previously seen;

setting a number y to be equal to the predetermined size minus a quantity of a remembered offset minus the current offset of the marker in the working block of data when the remembered offset is greater than or equal to the current offset of the marker, the number y being greater than or equal to zero;

setting the number y to be equal to the remembered offset minus the current offset of the marker in the working block of data when the remembered offset is less than the current offset of the marker;

setting the number y to be equal to the offset of the marker when the computed mathematical function of data around the marker has not been previously seen;

setting the number y to be equal to the predetermined size when the working chunk does not contain the marker;

setting a number x equal to an offset in the untransformed set of data corresponding to the offset of the number y in the working chunk of data, the number x being greater than or equal to zero;

shifting the location of the beginning of the next group of data by x data units; and returning to (b).

17. The method according to claim 1, wherein selecting a next group of data in step (d) comprises:

locating a marker in the next group of data;

computing a mathematical function of data around the marker;

determining whether a remembered offset is greater than or equal to a current offset of the marker when the computed mathematical function of data around the marker has been previously seen;

setting a number x to be equal to the predetermined size minus a quantity of a remembered offset minus the current offset of the marker in the next group of data when the remembered offset is greater than or equal to the current offset of the marker from an edge of the next group of data, the number x being greater than or equal to zero;

setting the number x to be equal to the remembered offset minus the current offset of the marker in the next group of data when the remembered offset is less than the current offset of the marker;

setting the number x to be equal to the offset of the marker when the computed mathematical function of data around the marker has not been previously seen;

setting the number x to be equal to the predetermined size when the next group of data does not contain the marker; shifting the location of the beginning of the next group of data by x data units; and returning to (b).

18. A program storage device, comprising:

a storage area; and information stored in the storage area, the information being readable by a machine and tangibly embodying a program of instructions executable by the machine for performing method steps for applying desired transformations to data such that the number of duplicate chunks in the transformed data is increased and the chunks are predominantly of a fixed size, the method comprising:

(a) selecting a group of data from the set of data, the selected group of data comprising a beginning and an end and being continuous between the beginning and the end of the selected group of data and such that a working chunk of data generated from the selected group of data is of size equal to a predetermined size;

(b) generating the working chunk of data from the selected group of data; by performing at least one of compression, an encoding of the selected group of data;

(c) determining whether the working chunk is a duplicate chunk of data;

(d) when the working chunk is not a duplicate chunk of data, selecting a next group of data from the set of data, the next selected group of data comprising a beginning and an end and being continuous between the beginning and the end of the next selected group of data, the beginning of the next group of data being a predetermined number of data units after the beginning of the current selected group of data, and returning to (b);

(e) when the working chunk comprises a duplicate chunk of data, dividing the data of the data set between the end of the last selected group of data that generated a working chunk that was a duplicate chunk of data and the beginning of the current selected group of data into one or more unique chunks.

* * * * *